(12) United States Patent
Song et al.

(10) Patent No.: US 7,113,531 B2
(45) Date of Patent: Sep. 26, 2006

(54) ASYMMETRIC WAVEGUIDE GAINAS LASER DIODE

(75) Inventors: Dae-sung Song, Gyeonggi-do (KR); Tak Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 250 days.

(21) Appl. No.: 10/794,028

(22) Filed: Mar. 8, 2004

(65) Prior Publication Data

US 2004/0245520 A1 Dec. 9, 2004

(30) Foreign Application Priority Data

May 7, 2003 (KR) .................. 10-2003-0028872

(51) Int. Cl.
*H01S 5/00* (2006.01)

(52) U.S. Cl. .................. 372/43.01; 372/45.01

(58) Field of Classification Search .................. 372/98, 372/44.011, 92, 46.01, 43.01; 438/487; 359/296; 435/287.2; 428/24

See application file for complete search history.

(56) References Cited

U.S. PATENT DOCUMENTS

| 5,904,549 A * | 5/1999 | Sato .................. 438/478 |
| 2002/0179929 A1* | 12/2002 | Takahashi et al. .......... 257/184 |
| 2003/0138014 A1* | 7/2003 | Lovisa .................. 372/45 |

* cited by examiner

*Primary Examiner*—Minsun Oh Harvey
*Assistant Examiner*—Tuan N. Nguyen
(74) *Attorney, Agent, or Firm*—Buchanan Ingersoll & Rooney PC

(57) ABSTRACT

A laser diode is provided. The laser diode has a structure in which reflective index of an n-cladding layer formed on a first face of the active layer is higher than that of a p-cladding layer formed on a second face. This asymmetric waveguide structure suppresses extension of field into the p-cladding layer thus reducing free carrier absorption in the p-cladding layer.

9 Claims, 3 Drawing Sheets

FIG. 1 Conventional
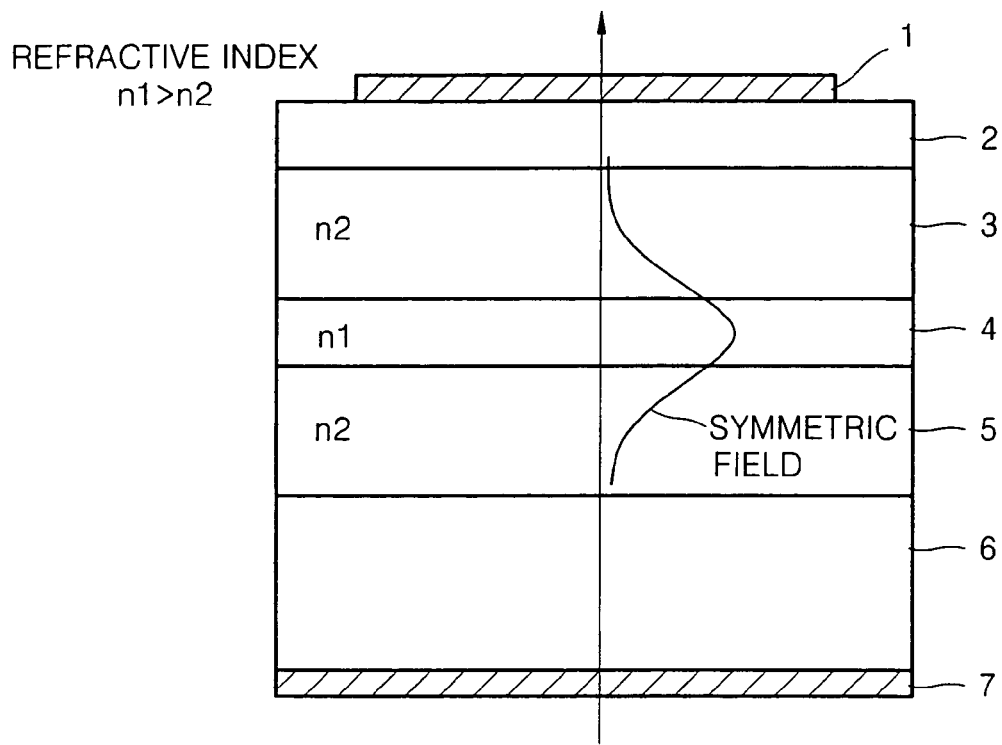
FIG. 2 Conventional
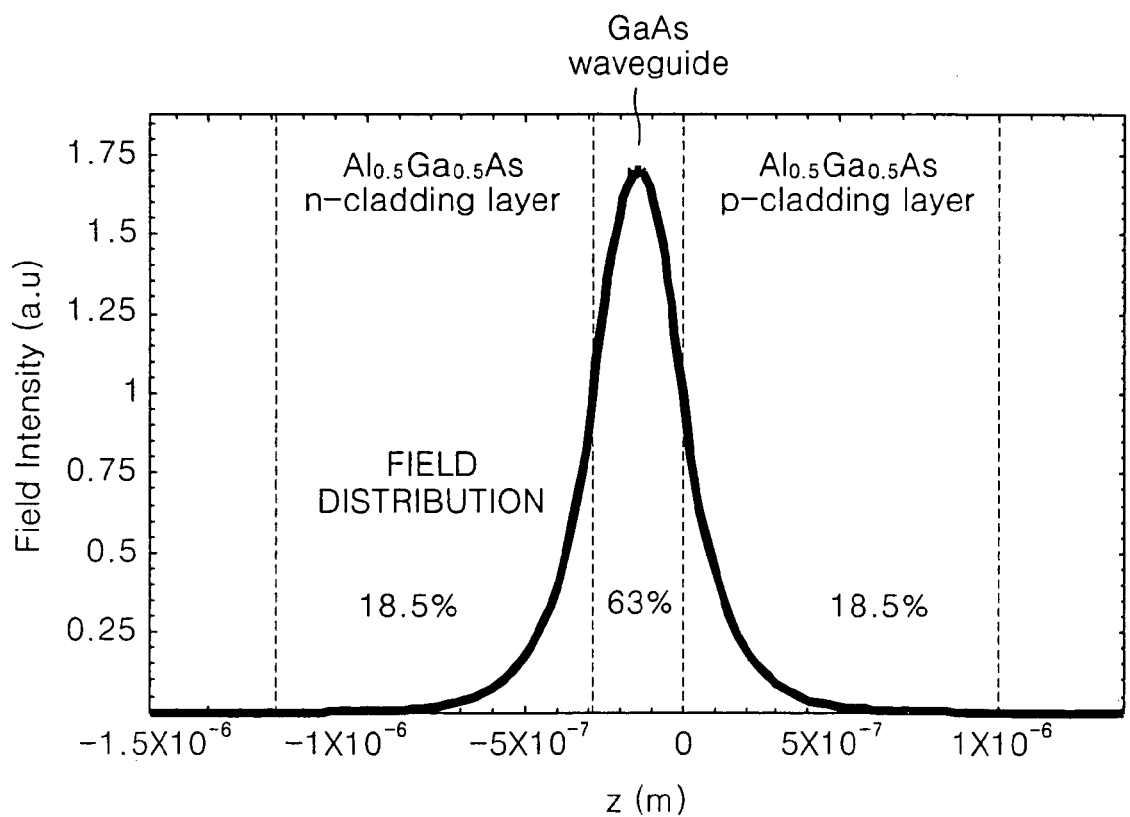

ASYMMETRIC WAVEGUIDE GAINAS LASER DIODE

This application claims the priority of Korean Patent Application No. 2003-28872, filed on May 7, 2003, the contents of which are incorporated herein by reference in their entirety.

BACKGROUND OF THE INVENTION

1. Field of the Invention

The present invention relates to a long-wavelength laser diode, and more particularly, to a GaInNAs laser diode having an asymmetric waveguide structure.

2. Description of the Related Art

U.S. Pat. No. 5,904,549 discloses a GaInAs laser diode. The GaInNAs laser diode, which is a long-wavelength laser device, has a structure as shown in FIG. 1.

Referring to FIG. 1, the conventional GaInAs laser diode is comprised of a GaAs substrate 6, an n-$Al_xGa_{1-x}As$ lower cladding layer 5, a $Ga_{1-x}In_xN_yAs_{1-y}$ active layer 4, and a p-$Al_xGa_{1-x}As$ upper cladding layer 3. On the upper cladding layer 3, a contact layer 2 and a p-electrode 1 are formed. An n-electrode 7 is formed on the bottom surface of the substrate 6.

The conventional laser diode has a symmetric waveguide structure in which the upper and lower cladding layers 3 and 5 are formed symmetrically with respect to the intervening active layer 4 having a high refractive index n1. In this case, the upper and lower cladding layers 3 and 5 have a refractive index n2 lower than the refractive index n1 of the active layer 4. Thus, as shown in FIGS. 1 and 2, FIELD is evenly distributed with respect to the p- and n-AlGaAs upper and lower cladding layers 3 and 5, and a considerable portion of the FIELD extends into the upper and lower cladding layer 3 and 5.

If this symmetric waveguide structure is applied to long-wavelength GaInNAs quantum wells on a GaAs substrate, field is densely distributed on a p-cladding layer, so free carrier absorption greatly affects the operation of the device. FIG. 3 is a graph showing free carrier absorption for each wavelength range. As evident from FIG. 3, free carrier absorption increases with an increasing wavelength and in particular absorption significantly increases in the p-cladding layer. Optical loss due to free carrier absorption in the p-cladding layer increases threshold current of a GaInNAs long-wavelength laser diode while reducing slope efficiency that is a change in output with respect to increase in current, thus degrading the performance of the device.

SUMMARY OF THE INVENTION

The present invention provides a laser diode designed to increase luminous efficiency while lowering operating current by reducing optical loss caused by free carrier absorption in a p-cladding layer.

According to an aspect of the present invention, there is provided a laser diode comprised of: an active layer having first and second faces; an n-cladding layer disposed on the first face of the active layer; a p-cladding layer disposed on the second face of the active layer; and a substrate that supports a stacked structure including the active layer and n- and p-cladding layers. Here, the refractive index of the p-cladding layer is lower than that of the n-cladding layer.

The active layer may contain GaInNAs/GaAs or GaIn-NAs/GaNAs quantum wells.

In one embodiment, the doping concentration of the p-cladding layer varies from one portion to another and increases moving toward the active layer. In another embodiment, the p-cladding layer may be thicker than the n-cladding layer.

This invention changes a symmetric waveguide structure used for a semiconductor laser diode having a waveguide structure, in particular, GaInNAs laser diode into an asymmetric waveguide structure, thus reducing free carrier absorption.

Since in asymmetric quantum wells, the centroid of field intensity is not positioned in the center of an active layer having a waveguide structure, it is necessary to form quantum wells away from the center of the active layer. Since free carrier absorption occurs to a great extent when the p-cladding layer interacts with field, refractive index of the p-cladding layer is made lower than that of the n-cladding layer thus creating an asymmetry in the index profile. The resulting asymmetric waveguide structure suppresses the field from extending into the p-cladding layer.

BRIEF DESCRIPTION OF THE DRAWINGS

The above objects and advantages of the present invention will become more apparent by describing in detail exemplary embodiments thereof with reference to the attached drawings in which:

FIG. 1 is a schematic cross-section of an example of a conventional long-wavelength laser diode;

FIG. 2 is graph showing symmetric field distribution in a conventional long-wavelength laser diode;

DETAILED DESCRIPTION OF THE INVENTION

Figure 3:
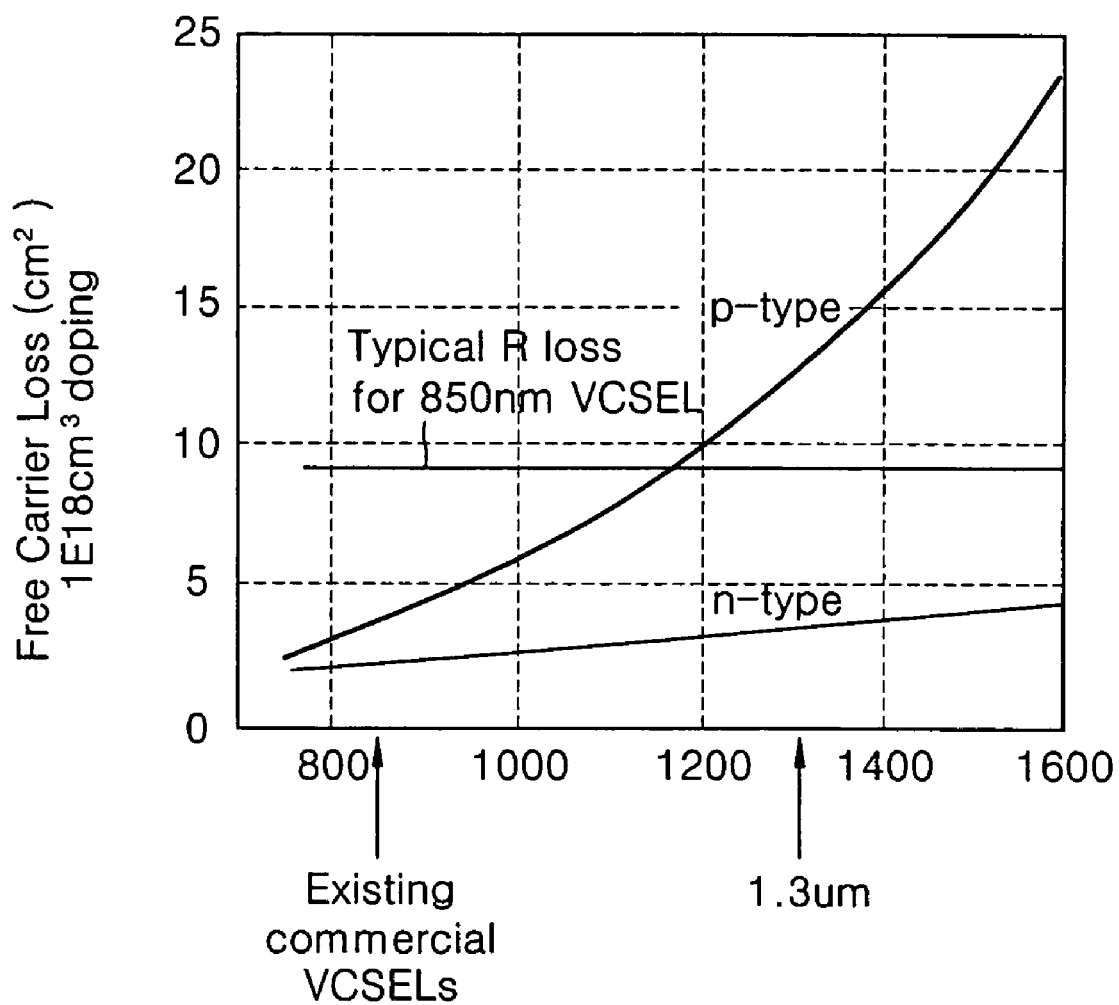
FIG. 3 is a graph showing free carrier loss versus wavelength in n- and p-semiconductor material layers.

A laser diode according to an embodiment of this invention will now be described. It should be noted that in the drawings, the thickness and height of each layer constituting a laser diode is exaggerated for clarity.

Figure 4:
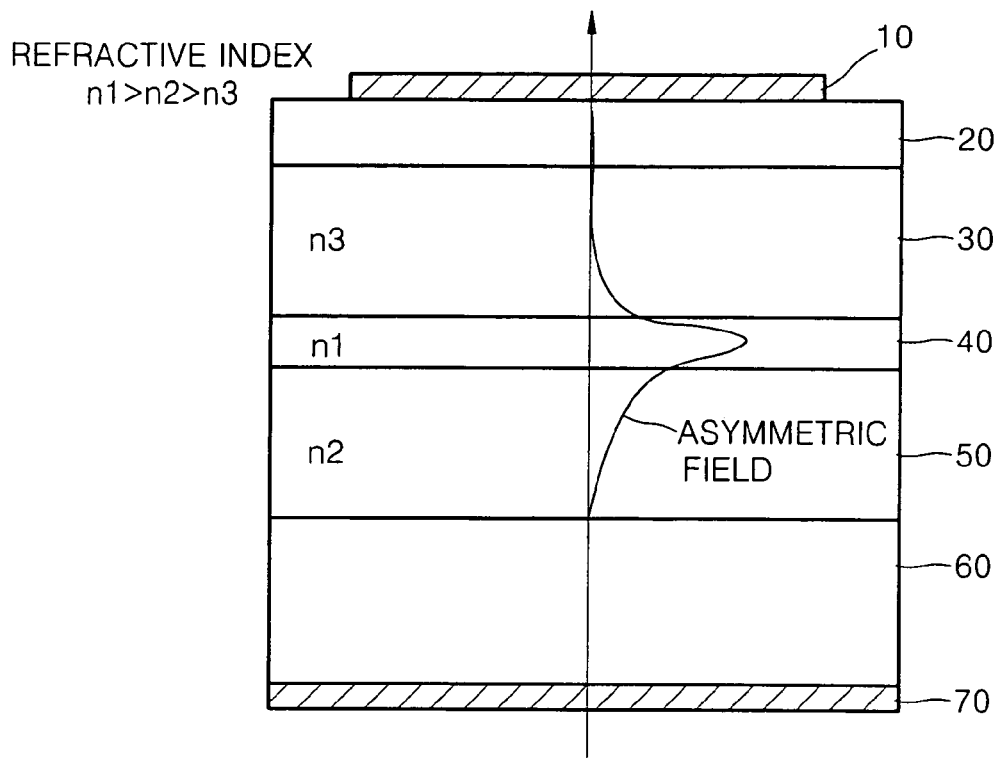
FIG. 4 is a schematic cross-section of a long-wavelength laser diode having an asymmetric waveguide structure according to an embodiment of the present invention.

Referring to FIG. 4, a semiconductor laser diode includes a GaAs substrate 60, an n-$Al_{0.3}Ga_{0.7}As$ lower cladding layer 50, a $Ga_{1-x}In_xN_yAs_{1-y}$ (GaInNAs/GaAs or GaInNAs/Ga-NAs) active layer 40, and a p-$Al_{0.5}Ga_{0.5}As$ upper layer 30. On the upper cladding layer 30, a contact layer 20 and a p-electrode 10 are formed. An n-electrode 70 is formed on the bottom surface of the substrate 6. Here, a first surface of the active layer 40 faces the substrate while a second face thereof faces the opposite direction. Thus, the n-lower cladding layer 50 and the upper n-cladding layer 30 are disposed on the first and second faces of the active layer 40, respectively.

Here, the active layer 40 may have a single quantum well or multiple quantum well structure. The active layer 40 has a first refractive index n1 higher than those of the p-upper cladding layer and n-lower cladding layers 30 and 50. The n-lower cladding layer 50 underlying the active layer 40 has a second refractive index n2 that is lower than the first refractive index n1, and the p-upper cladding layer 30 overlying the active layer 40 has a third refractive index n3 that is lower than the second refractive index n2.

In the laser diode of this invention, the active layer 40 includes GaInNAs/GaAs or GaInNAs/GaNAs quantum wells.

Furthermore, doping concentration of the p-upper cladding layer 30 varies from one portion to another. That is, the doping concentration in the p-upper cladding layer 30 increases moving toward the active layer 40, thus further prohibiting the field from extending into the p-upper cladding layer 30.

To more strongly suppress extension of field into the p-upper cladding layer 30, it is preferable that the p-upper cladding layer 30 is made thicker than the n-lower cladding layer 50.

Figure 5:
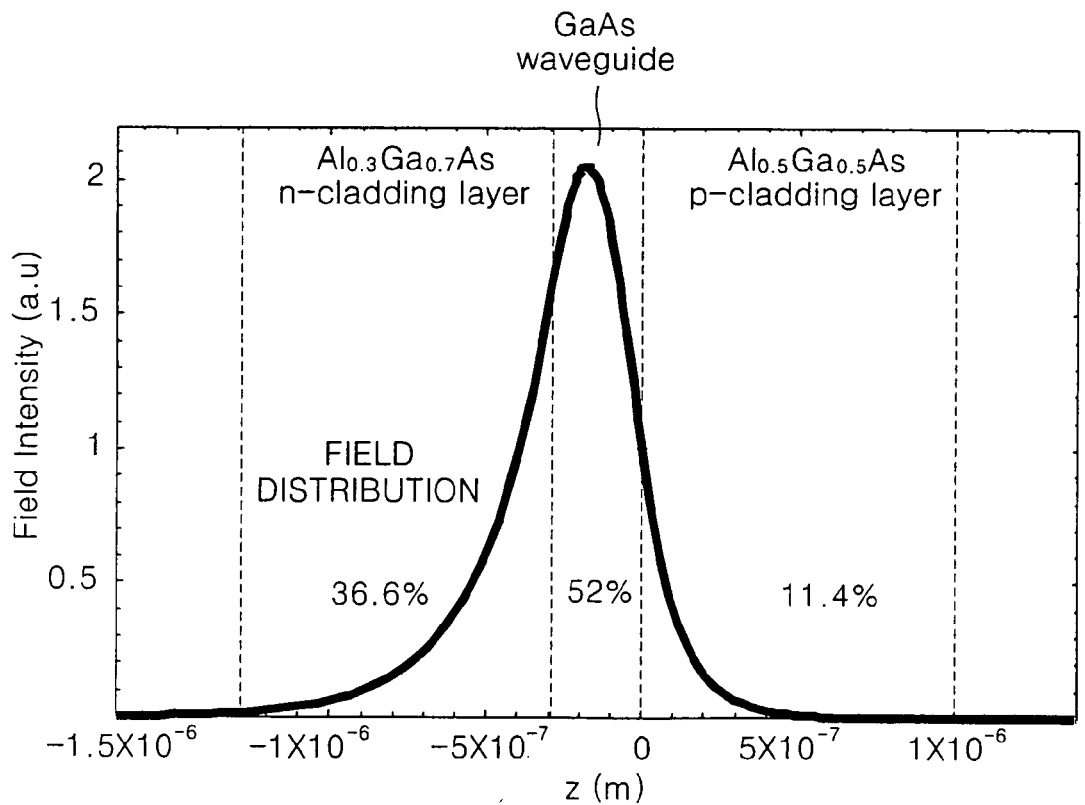
FIG. 5 shows asymmetric field distribution of a laser diode according to the present invention.

Thus, the laser diode of this invention has an asymmetric waveguide structure in which the upper and lower cladding layers 30 and 50 have an asymmetric refractive index profile with respect to the active layer 40. Thus, as shown in FIGS. 4 and 5, FIELD is distributed asymmetrically with respect to the p- and n-AlGaAs upper and lower cladding layers 30 and 50, and field in the p-upper cladding layer 30 is degenerated more than that in the n-lower cladding layer 50. To achieve this, Al content ratio of the p-upper cladding layer 30 is greater than that of the n-lower cladding layer 50.

Typically, as described above, a conventional laser diode has a symmetric waveguide structure. A long-wavelength laser diode on a traditional InP substrate has employed this symmetric waveguide structure. However, for a GaInNAs laser diode used as a long-wavelength light source on a GaAs substrate, it is possible to use AlGaAs that can easily change a refractive index for a cladding layer. Thus, this can compensate the drawback of a long-wavelength laser diode having a symmetric waveguide structure.

Turning to FIG. 3, optical loss arises significantly from free carrier absorption at a long-wavelength (greater than 1,000 nm). The optical loss occurs when field interacts with a p-cladding layer. While the p-cladding layer should be heavily doped to improve its electric characteristics, this also induces severe optical loss. Thus, to optimize the structure, as shown in FIG. 4, this embodiment makes the refractive index n3 of the p-upper cladding layer 30 lower than that of the n-lower cladding layer 50 thus allowing field to be densely distributed on the active layer 40 and the n-lower cladding layer 50. As evident from comparison between FIGS. 2 and 5, the field intensity in the p-upper cladding layer 30 is reduced to less than half the field intensity compared to a conventional laser diode. This asymmetric field distribution makes it possible to keep optical loss as low as possible although the p-upper cladding layer 30 is heavily doped. Thus, this significantly improves the characteristics of the laser diode according to this disclosure, in particular, threshold current and slope efficiency. Here, to increase optical gain as much as possible, quantum wells on the active layer 40 can be located at a position away from the center of the active layer 40 so that the GaInNAs active layer 40 coincides with field peak.

The above structure can be applied to any long-wavelength laser diode that permits change in reflective index.

In a typical stacked structure, an n-semiconductor material layer is formed to face a substrate while a p-semiconductor material layer overlies the n-semiconductor material layer. However, it is generally known that the n-semiconductor material layer can overlie the p-semiconductor material layer. These modifications in stacked structure do not limit the scope of this invention.

Furthermore, an additional layer having various functions is formed on the above stacked structure. Additional layer formation also does not limit the scope of this invention.

As described above, embodiments of this invention can reduce optical loss in long-wavelength laser diode having a waveguide structure thus decreasing threshold current density and increasing slope efficiency. This invention can be appropriate for use in laser diodes, in particular, GaInNAs laser diode.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A laser diode comprising:
    an active layer having first and second faces;
    an n-cladding layer disposed on the first face of the active layer;
    a p-cladding layer disposed on the second face of the active layer; and
    a substrate that supports a stacked structure including the active layer and n- and p-cladding layers,
    wherein the refractive index of the p-cladding layer is lower than that of the n-cladding layer,
    wherein the doping concentration of the p-cladding layer varies from one portion to another and increases moving toward the active layer.

2. The laser diode of claim 1, wherein the active layer contains GaInNAs/GaAs quantum wells.

3. The laser diode of claim 2, wherein the p-cladding layer is thicker than the n-cladding layer.

4. The laser diode of claim 2, wherein the p-cladding layer is thicker than the n-cladding layer.

5. The laser diode of claim 1, wherein the active layer contains GaInNAs/GaNAs quantum wells.

6. The laser diode of claim 5, wherein the p-cladding layer is thicker than the n-cladding layer.

7. The laser diode of claim 5, wherein the p-cladding layer is thicker than the n-cladding layer.

8. The laser diode of claim 1, wherein the p-cladding layer is thicker than the n-cladding layer.

9. The laser diode of claim 1, wherein the p-cladding layer is thicker than the n-cladding layer.

* * * * *